(12) United States Patent
Bentivegna et al.

(10) Patent No.: US 9,146,544 B2
(45) Date of Patent: *Sep. 29, 2015

(54) UNIFIED AND FLEXIBLE CONTROL OF MULTIPLE DATA CENTER COOLING MECHANISMS

(71) Applicant: International Business Machines Corporation, Armonk, NY (US)

(72) Inventors: Tony A. Bentivegna, Westerville, OH (US); Bradley L. Brech, Rochester, MN (US); Rajarshi Das, Armonk, NY (US); Murthy V. Devarakonda, Peekskill, NY (US); Hendrik F. Hamann, Yorktown Heights, NY (US); Jeffrey O. Kephart, Cortlandt Manor, NY (US); Bret W. Lehman, Raleigh, NC (US); Jonathan Lenchner, North Salem, NY (US); Christopher L. Molloy, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 54 days.

This patent is subject to a terminal disclaimer.

(21) Appl. No.: 13/684,612

(22) Filed: Nov. 26, 2012

(65) Prior Publication Data
US 2013/0085611 A1 Apr. 4, 2013

Related U.S. Application Data

(63) Continuation of application No. 13/104,571, filed on May 10, 2011.

(51) Int. Cl.
*G05D 23/19* (2006.01)
*G05B 13/02* (2006.01)
*H05K 7/20* (2006.01)

(52) U.S. Cl.
CPC ............ *G05B 13/02* (2013.01); *G05D 23/1934* (2013.01); *H05K 7/20836* (2013.01)

(58) Field of Classification Search
CPC . G05B 13/02; G05D 23/1934; H05K 7/20836
USPC ......................................................... 700/276
See application file for complete search history.

(56) References Cited

U.S. PATENT DOCUMENTS 6,747,872 B1 * 6/2004 Patel et al. .................... 361/695
7,861,102 B1 * 12/2010 Ranganathan et al. ....... 713/300
(Continued)

OTHER PUBLICATIONS

Das et al, "A Unified Approach to Coordinated Energy-Management in Data Centers", CNSM 2011, Oct. 2011, pp. 504-508.*

(Continued)

*Primary Examiner* — Kenneth M Lo
*Assistant Examiner* — Olvin Lopez Alvarez
(74) *Attorney, Agent, or Firm* — Patterson & Sheridan, LLP

(57) ABSTRACT

Techniques are described for controlling the climate in a data center. Using the input of an administrator, multiple desired attributes of a data center (e.g., temperature, energy consumption, costs, or system performance) may be balanced using a utility function that maximizes the utility of the computing systems in the data center according to the administrator's preferences. Additionally, a cooling model is generated that represents the affect of a control parameter (e.g., the fan speed of a CRAC) on the desire attributes of the data center. The cooling model may then be substituted into the utility function to replace the desired attributes. Using this new utility function, the control parameters may be varied such that the maximum utility is achieved.

7 Claims, 5 Drawing Sheets

(56) References Cited

U.S. PATENT DOCUMENTS

| | | | |
|---|---|---|---|
| 8,346,398 B2* | 1/2013 | Ahmed et al. | 700/278 |
| 2003/0041042 A1* | 2/2003 | Cohen et al. | 706/45 |
| 2005/0192680 A1* | 9/2005 | Cascia et al. | 700/29 |
| 2008/0313492 A1* | 12/2008 | Hansen | 714/5 |
| 2010/0235011 A1* | 9/2010 | Tolia et al. | 700/296 |
| 2011/0093128 A1* | 4/2011 | Wang et al. | 700/295 |
| 2012/0005505 A1* | 1/2012 | Tolia et al. | 713/320 |
| 2012/0197444 A1* | 8/2012 | Wang et al. | 700/276 |
| 2013/0073080 A1* | 3/2013 | Ponulak | 700/246 |
| 2013/0085611 A1* | 4/2013 | Bentivegna et al. | 700/276 |

OTHER PUBLICATIONS

Kephart et al, "Coordinating multiple autonomic managers to achieve specified power-performance tradeoffs Coordinating multiple autonomic managers to achieve specified power-performance tradeoffs" IEEE, 2007, pp. 1-10.*

Moore et al "Making Scheduling "Cool": Temperature-Aware Workload Placement in Data Centers" 2005, pp. 61-74.*

Walsh et al "Utility Functions in Autonomic Systems", 2004, pp. 8.*

Das, Rajarshi et al, "Utility-Function-Driven Energy-Efficient Cooling in Data Centers, Proceeding of the 7th international conference on Autonomic computing, 2010, pp. 61-70, ACM, New York, New York, USA".*

Kephart et al, "Achieving Self-Management via Utility Functions", 2007, pp. 40-47.*

U.S. Appl. No. 13/104,571, entitled Unified and Flexible Control of Multiple Data Center Cooling Mechanisms, filed May 10, 2011.

Das, Rajarshi et al., Utility-Function-Driven Energy-Efficient Cooling in Data Centers, Proceeding of the 7th international conference on Autonomic computing, 2010, ACM, New York, United States.

Parolini, Luca et al, Reducing Data Center Energy Consumption Via Coordinated Cooling and Load Management, Proceedings of the 2008 conference on Power aware computing and systems, 2008, USENIX Association Berkeley, United States.

Raghavenora, Ramya et al, No "Power" Struggles: Coordinated Multi-level Power Management for the Data Center, Proceedings of the 13th international conference on Architectural support for programming languages and operating systems, 2008, New York, United States.

Moore, Justin et al, Making Scheduling "Cool": Temperature-Aware Workload Placement in Data Centers, 2005 USENIX Annual Technical Conference, USENIX Association Berkeley, United States.

Chen, Gong et al, Energy-Aware Server Provisioning and Load Dispatching for Connection-Intensive Internet Services, NSDI'08 Proceedings of the 5th USENIX Symposium on Networked Systems Design and Implementation, 2008, USENIX Association Berkeley, United States.

Bash, Cullen et al, Cool Job Allocation: Measuring the Power Savings of Placing Jobs at Cooling-Efficient Locations in the Data Center, ATC'07 2007 USENIX Annual Technical Conference on Proceedings of the USENIX Annual Technical Conference, 2007 USENIX Association Berkeley, United States.

* cited by examiner

UNIFIED AND FLEXIBLE CONTROL OF MULTIPLE DATA CENTER COOLING MECHANISMS

CROSS-REFERENCE TO RELATED APPLICATIONS

This application is a continuation of U.S. patent application Ser. No. 13/104,571, filed May 10, 2011. The aforementioned related patent application is herein incorporated by reference in its entirety.

BACKGROUND

Many data centers are typically cooled by operation of one or more different types of air conditioning units. Primarily, Computer Room Air Conditioning (CRAC) units and water-based cooling distribution units (CDU) perform the majority of the cooling needs. However, a substantial percentage of existing data centers will have insufficient power and cooling capacity in the near future. Even if this increasing need is met, power is one of the highest operating costs (after labor) in the majority of all data centers. Moreover, data centers are responsible for the emission of tens of million of metric tons of carbon dioxide emissions annually.

A data center may be defined as a location that houses numerous IT devices that contain printed circuit (PC) board electronic systems arranged in a number of racks. A standard rack may be configured to house a number of PC boards, e.g., about forty boards. The PC boards typically include a number of components, e.g., processors, micro-controllers, high-speed video cards, memories, semiconductor devices, and the like, that emanate relatively significant amounts of heat during operation. For example, a typical PC board comprising multiple microprocessors may consume approximately 250 W of power. Thus, a rack containing forty PC boards of this type may consume approximately 10 KW of power.

The power required to dissipate the heat produced by the components in the racks is generally equal to about 30 percent of the power needed to operate the components. However, the power required to dissipate the heat produced by a plurality of racks in a data center is equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, across the heat emanating components; whereas, data centers often implement reverse power cycles to cool heated return air. In addition, various cooling mechanisms have different cooling efficiencies. For example, water-cooling units operate more efficiently than air-cooling units, but are costlier to install. The additional work required to achieve the temperature reduction, in addition to the work associated with moving the cooling fluid in the data center and the condenser, often add up to the 50 percent power requirement. As such, the cooling of data centers presents problems in addition to those faced with the cooling of racks.

SUMMARY

Embodiments of the invention provide a method, system and computer program product for controlling temperature in a computer environment by receiving a plurality of desired attributes for the computing environment, wherein a first desired attribute relates to a first system condition of the computing environment and a second desired attribute relates to a second system condition of the computing environment, wherein the first system condition is temperature. The method, system and computer program further provide at least one control parameter in a computing environment, where the control parameter affects at least the temperature and the second system condition of the computing environment. The method, system and computer program generate a cooling model representing the effect of the control parameter on at least the first and second desired attributes and a utility function for the computing environment based on the cooling model and at least the first and second desired attributes. Finally, the method, system and computer program set a value of the control parameter based on the utility function.

Embodiments of the invention provide a method for controlling a system condition in a computing environment by receiving a desired attribute for the computing environment, wherein the desired attribute specifies a desired value of the at least one system condition and providing a plurality of control parameters in a computing environment, wherein the control parameters affect the at least one system condition of the computing environment. The method generates a cooling model to relate the at least one system condition and the control parameters, where each control parameter manages a different type of cooling system, and where each type of cooling system uses a different cooling technique of affecting the at least one system condition of the computing environment. The method determines a value for each of the control parameters based on the cooling model and operates the cooling systems based on the values to achieve the desired attribute.

BRIEF DESCRIPTION OF THE DRAWINGS

So that the manner in which the above recited aspects are attained and can be understood in detail, a more particular description of embodiments of the invention, briefly summarized above, may be had by reference to the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
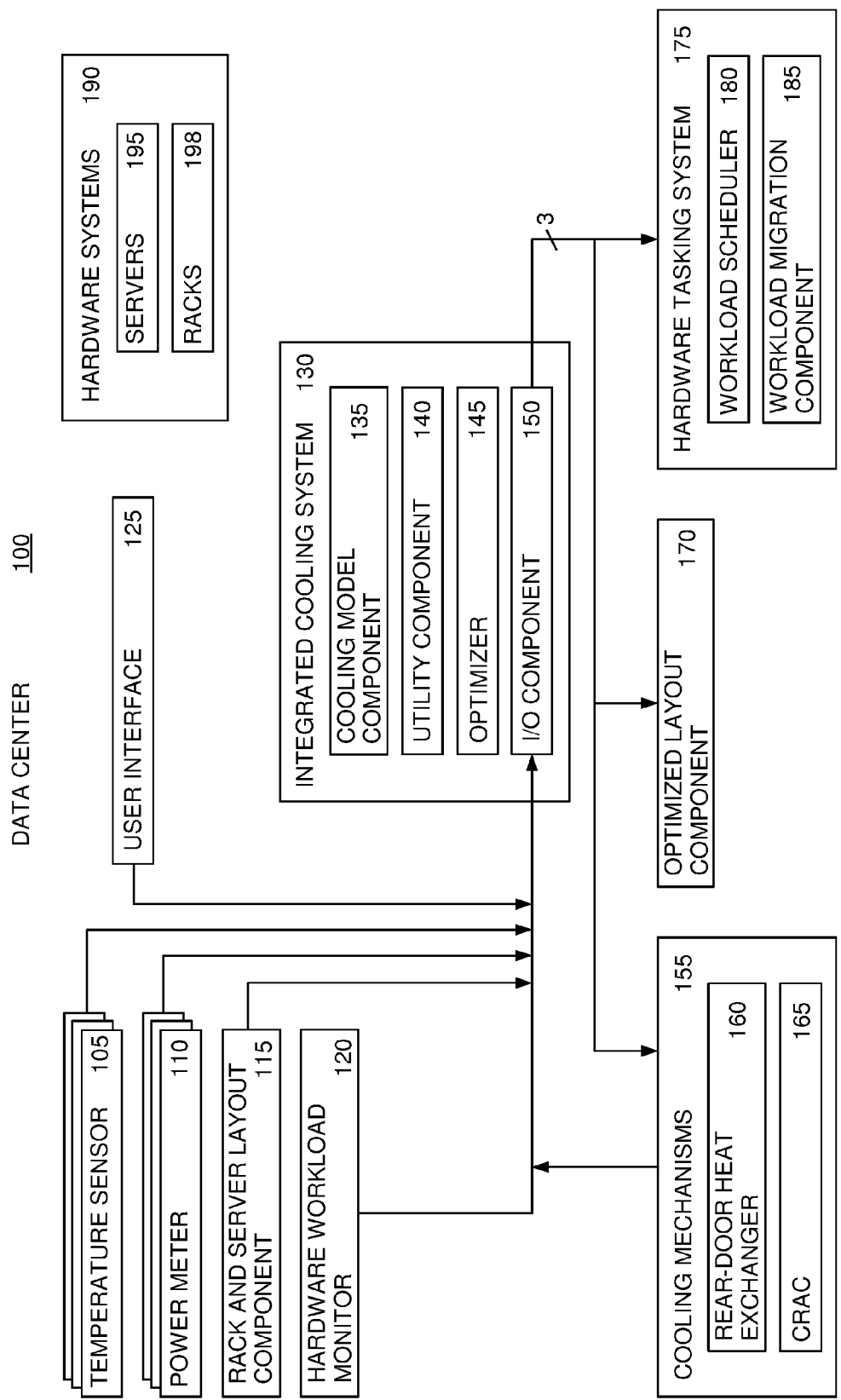
FIG. 1 is a block diagram illustrating a data center with an integrated cooling system, according to an embodiment of the invention.

To meet the future demands of data center cooling, embodiments of the present invention coordinate multiple cooling system types, such as CRAC, CDU or workload schedulers, to determine a unified solution for a particular data center. By collectively considering a plurality of cooling systems, a more efficient solution may be obtained. Moreover, utility functions are used to prioritize an administrator's preferences. Thus, an embodiment of the invention may use an administrator's preferences to determine a maximum utility, and coordinate different methods of cooling to efficiently achieve the desired result.

An embodiment of the present invention prompts an administrator to set desired attributes of a data center, e.g., the maximum temperature or energy consumption. These attributes are then input to a utility function to identify the maximum utility. Additionally, a model is developed that represents the effect of the different control parameters—e.g., the fan speed of a CRAC or the flow rate of liquid from a CDU—on the desired attributes. That is, changing the control parameters affects the system conditions of the data center (i.e., temperature at a sensor or energy consumed by a certain server). The model describes what setting must be used on the control parameters to change the system conditions such that the system conditions satisfy the desired attribute or attributes—e.g., maintaining a temperature below a maximum value. Using this relationship, the model is then substituted into the utility function to yield the maximum utility in terms of the control parameters rather than in terms of the desired attributes. After optimization, the control parameters are assigned the values from the utility function that produce the desired attributes.

In another embodiment, after the control parameters are assigned values, the data center continues to collect information from various sensors to record any changes in the system—i.e., a feedback loop. If, for example, the workload increases and additional heat is emitted, this new information can then be used to determine or implement a new model based on the changed system conditions. The new model is substituted into the utility function to yield the maximum utility in terms of the control parameters. This monitoring feature allows the invention to dynamically maintain the administrator's desired attributes even as the system conditions vary with time.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 is a block diagram illustrating a data center 100 with an integrated cooling system 130, according to one embodiment of the invention. As shown, FIG. 1 includes various inputs which describe and record the environment of the data center 100, an integrated cooling system 130, various cooling systems which implement the control parameters assigned by the integrated cooling system 130, and a hardware system 190 which includes any number of servers 195 and racks 198.

A plurality of temperature sensors 105 may be placed around the data center. Each temperature sensor 105 may send information directly to the integrated cooling system 130, or alternatively, the aggregate information is used to extrapolate a temperature gradient for the data center 100. Power meters 110 are also used to record how different components are consuming energy. For example, each CRAC 165 or CDU 160 may have an individual power meter 110. The rack and server layout component 115 records the layout of the servers 195 and racks 195 respective to the floor plan of the data center and transmits that layout to the integrated cooling system 130. Because an output vent of a CRAC unit 165 may cool racks 198 which are closer more efficiently than racks 198 that are located farther away, the layout aids the integrated cooling system 130 in determining a cost-effective cooling plan. In addition to temperature sensors 105 and power meters 110, the data center 100 may include pressure sensors that record the output of each plenum from a CRAC 165. The user interface 125 gives an administrator the ability to communicate with the integrated cooling system 130. An administrator uses the user interface 125 to establish, for example, the acceptable temperature and energy consumption of the data center 100. Furthermore, as will be understood by one of ordinary skill in the art, any type of recording or measuring device that performs the functions described herein may be used.

The integrated cooling system 130 gathers all of the various inputs, determines the proper values for the control parameters, and outputs these parameters to the cooling systems. The details of this function will be discussed in further detail below. The integrated cooling system 130 includes a cooling model component 135, utility component 140, optimizer 145, and I/O component 150. The cooling model component 135 creates a model that relates the control parameters (i.e., the different values the integrated cooling system 130 can manipulate to change the desired attributes such as temperature) to the maximum temperature or energy consumption requested by the administrator. In general, the administrator conveys to the integrated cooling system 130 what settings she wants via the user interface 125, and the cooling model component 135 produces a model relating the control parameters to each setting or attribute. The utility component 140 performs two functions. First, the utility component 140 takes each attribute inputted by an administrator and creates a utility function in terms of the combined attributes. This utility function balances the different desired attributes to yield the maximum utility. Second, the utility component 140 uses the models created by the cooling model component 135 to change the utility functions from being in terms of the desired attributes to being in terms of the control parameters. This altered utility function is then sent to the optimizer 145 which uses an optimizing algorithm to output values for the control parameters that result in the greatest utility between the desired attributes.

In one embodiment, the integrated cooling system 130 may be a program located in memory, which when executed by a processor, controls the system conditions of the data center 100 by setting control parameters. Though not shown, the program that performs the functions of the integrated cooling system 130 may be run on one of the servers 195 of the hardware systems 190 or be executed on a separate computing system that is located either inside or outside the data center 100.

The data center 100 contains three types of cooling systems. The first, a cooling mechanism 155, refers to any kind of fluid-cooling device, whether liquid or air. The rear-door heat exchanger 160 is an example of a liquid-based cooling mechanism 155, while the CRAC 165 is an air-based cooling mechanism 155. With these devices, the integrated cooling system 130 outputs control parameters such as fan speed or pump pressure to affect the temperature of the data center 100. Different types of cooling methods may include the fans on the servers 195, embedded cooling systems (e.g., associated with a processor in a server 195), heat containment systems, in-row cooling, and overhead cooling. All of these methods and cooling mechanisms 155 may be used to create a unified and flexible cooling plan.

Second, the integrated cooling system 130 can output control parameters to the optimized layout component 170 which then creates an optimized layout for the data center. Instead of changing the amount of cooling, the suggested layout of the optimized layout 170 may offer a more efficient use of current resources. For example, the optimized layout may tell the administrator to move a rack from one location to another. Alternatively, the layout may specify adding different data center cooling equipment to the layout which will be discussed later. Though not shown in FIG. 1, the optimized layout may be transmitted to an administrator via the user interface 125 or other similar method.

Third, the hardware tasking system 175 is another alternative to satisfy an administrator's desired attributes without having to increase power to the cooling mechanisms 155. The hardware workload monitor 120 evaluates the different workloads of the servers 195 (the connection is not shown in FIG. 1) and sends that information to the integrated cooling system 130 which then transmits instructions to the hardware tasking system 175. These instructions control the function of the workload scheduler 180 and workload migration component 185.

The workload scheduler 180 delays tasks from a time when the hardware systems 190 are in demand to a time when the hardware systems 190 are idle. Moreover, the workload schedules 180 can either work in conjunction with, or independent from, a scheduler found on the hardware system 190 itself. Because not all servers 195 and racks 198 are cooled equally, the hardware tasking system 175 also includes a workload migration component 185. As an example, a temperature sensor 105 on one rack 198 may report a higher temperature than a temperature sensor 105 on a different rack 198 based purely on distance from an output plenum of a CRAC 165. The integrated cooling system 130 can output a control parameter to the workload migration component 185 to shift workload from the hotter rack 198 to the cooler rack 198. As one of ordinary skill in the art will recognize, the workload migration component 185 can work in tandem with the workload scheduler 180 to lower the temperature without requiring more energy. Furthermore, as will be understood by one of ordinary skill in the art, any type of cooling system that performs the functions described herein, or any combination thereof, may be used.

Figure 2:
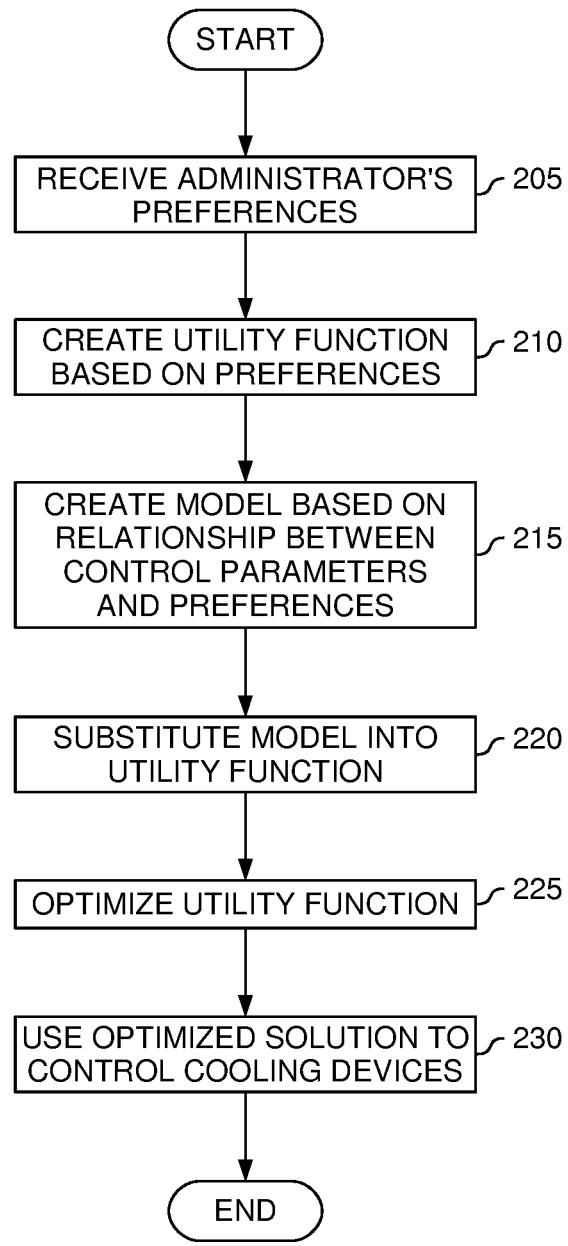
FIG. 2 is a flow diagram illustrating methods of cooling a data center, according to embodiments of the invention.

FIG. 2 illustrates a flow diagram implementing the system described in FIG. 1, according to one embodiment of the invention. At step 205, the integrated cooling system 130 receives as an input the administrator's desired attributes via the user interface 125. In many cases, temperature is one of these desired attributes. However, the desired temperature is not limited to a static value. Instead, temperature may be a range, a maximum or minimum, or a function. For example, an administrator may desire that the temperature in a data center 100 not exceed 80 degrees. Alternatively, the administrator could draw a graphical representation of a function representing desired temperature on the user interface 125. Or the user interface 125 may display the layout of the data center with indicated hot spots and allow the administrator to choose which spots to maintain at a certain temperature. Moreover, the administrator may provide a range from which the integrated cooling system 130 could extrapolate a function. Besides temperature, an administrator may specify energy, cost, system performance, or expected hardware lifetime as a desired attribute. Each of these possible desired attributes will be discussed in detail.

Corresponding with the rising demand for more cooling is the need for more energy to power the cooling mechanisms 155. As discussed previously, energy consumption can increase operating expenses and harm the environment. As such, an administrator may identify temperature and energy consumption as desired attributes. Similarly to temperature, the administrator may input a fixed amount, a maximum or minimum, a range, or a function. The integrated cooling system 130 can also extrapolate a function from a range or graphical representation.

Cost is another desired attribute which can be implemented in at least two ways: first, the cost of the energy, and second, the cost of the hardware. As to the former, the economic cost of energy may be an important concern to the operation of a data center 100. Thus, an administrator can input into the user interface 125 the cost per unit of energy. Alternatively, the cost may change according to the time of day. In such a case, the administrator inputs the different costs according to the time of the day, and the integrated cooling system 130 could, for example, extrapolate that information into a combined step function. As for the latter, hardware systems 190 deteriorate at rate that depends at least in part on temperature. Thus, a hardware device that remains consistently cool is generally expected to have a longer lifespan than one that experiences frequent overheating. An administrator may input an equation representing the replacement costs of hardware according to temperature as a desired attribute. Finally, the two ways of implementing cost may be combined to model the total cost of ownership (TCO). The TCO accounts for operational costs such as water usage for operating a CDU 160.

Environmental concerns are a desired attribute related to energy. Given the impact on the environment caused by carbon-dioxide emissions, an administrator may cap the maximum energy consumed by the cooling mechanisms 155. For example, this cap could help to achieve a specific environmentally-friendly certification. In such a case, instead of merely increasing the fan speed of a cooling mechanism 155, the integrated cooling system 130 could use the hardware tasking system 175 to maintain a specified temperature yet circumvent the need for more energy.

Another desired attribute may be system performance. For example, an administrator may require that (1) any request to a database under five gigabytes take less than half a second and (2) the temperature remain within certain range. One of ordinary skill in the art will recognize that servers 195 with a higher workload produce more heat than servers 195 with a lighter workload. Therefore, the integrated cooling system 130 balances these competing attributes using a utility function.

Finally, one of ordinary skill will recognize that the desired attributes can be any combination of attributes discussed previously—e.g., temperature, energy, environmental concerns, cost, system performance, and hardware lifetime—as well as related attributes that were not specifically discussed. For example, relative humidity—the percentage of water vapor that exists in a gaseous mixture of air—may also be modeled as a desire attribute since climate control depends heavily on the percentage of water vapor in the air.

At step 210, the desired attributes are formed into utility functions. In this embodiment, utility functions are relationships based on user input that maximize utility. The utility component 140 first creates a utility function for each desired attribute based on the information provided by the administrator via the user interface 125. The utility component 140 then combines these functions to create a single utility function. In order to provide a greater understanding of this process, a more detailed example is appropriate.

In this example, the desired attributes include energy (E) and temperature (T). Beginning with energy, the utility component takes an administrator's input and creates a utility function based solely on energy.

$$U_E(E) = \pi(E_0 - E) \qquad (1)$$

Equation 1 is a linear utility function ($U_E(E)$) of energy consumed (E) according to some constant ($E_0$) that represents a maximum desired energy. As the energy consumed approaches the value of the maximum desired energy, the utility decreases. Conversely, as energy consumed decreases, the utility increases. Another way of expressing utility is as the administrator's satisfaction. Accordingly, in equation 1, the administrator's satisfaction increases as less energy is consumed. Stated differently, the administrator configures the integrated cooling system 130 to recognize which energy values make her satisfied or unsatisfied. In equation 1, the administrator would be most satisfied if energy consumed (E) is zero and completely dissatisfied if energy consumed is above the maximum energy ($E_0$). Because the equation is linear, the utility decreases at the same rate that energy consumed increases.

Next, the utility component 140 extrapolates the utility function for temperature.

$$U_T(T) = \Pi \frac{1}{1 + e^{-\alpha(T_{max} - T_i)}} \qquad (2)$$

Equation 2 is an example of a possible utility function dependent on temperature—i.e., a desired temperature at a single location in the data center 100. Unlike the linearity of equation 1, equation 2 models a steep slope near the maximum temperature desired ($T_{max}$). Accordingly, as the temperature at the location ($T_i$) approaches the maximum temperature, the utility decreases rapidly. This function closely represents the real-world situation where any temperature below a certain point has little impact on hardware, but a temperature slightly above that point disproportionately deteriorates the physical hardware. Thus, the administrator quickly becomes less satisfied (i.e., less utility) as the temperature moves closer to $T_{max}$.

In order to balance both energy and temperature, the utility component 140 then combines the two utility equations.

$$U(E, T) = \frac{\pi(E_0 - E)}{1 + e^{-\alpha(T_{max} - T)}} \quad (3)$$

Equation 3 is a simplified combination of equation 1 and 2. Moreover, equation 3 illustrates the each desired attribute is balanced against the other. For example, if energy consumed (E) is decreased, the overall utility increases; however, decreasing energy may cause the temperature to rise. Thus, equation 3 demonstrates how the utility component 140 combines the multiple utility functions to find the maximum utility. In this example, there is a single value for both energy (E) and temperature (T) where utility is maximized. In other examples, the utility function may have multiple solutions which require using an optimization technique to determine the best solution from a known set of solutions.

Figure 4:
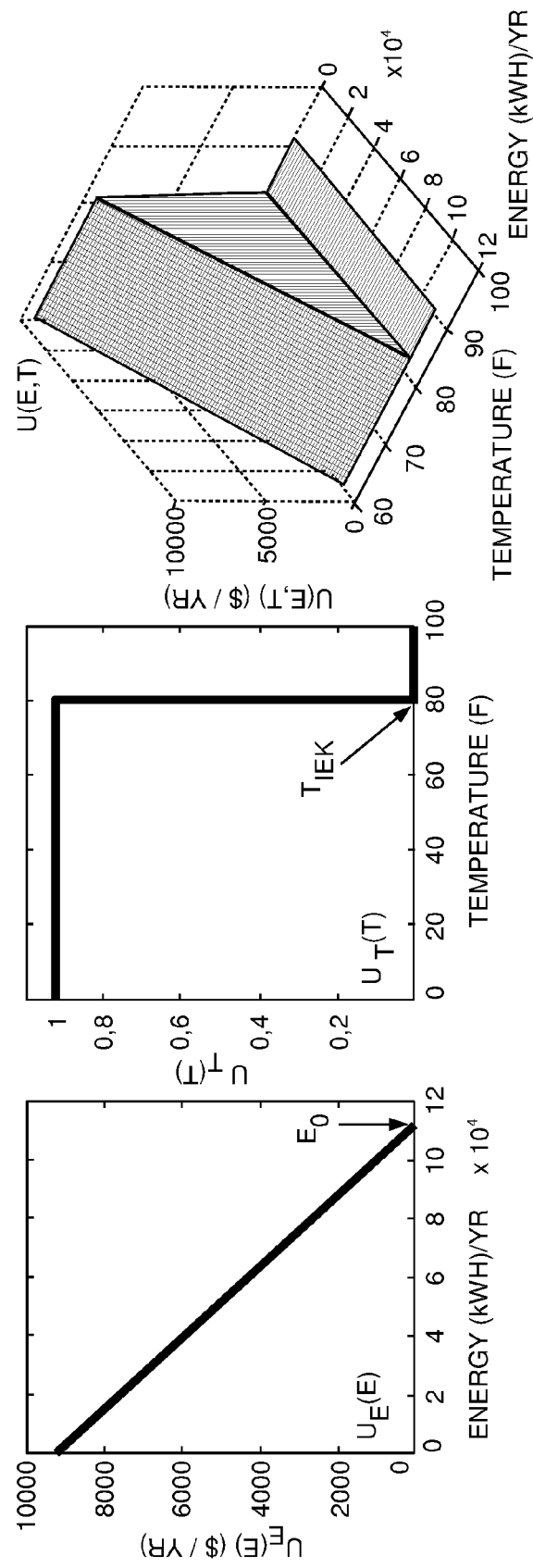
FIG. 4A-4C are graphical representations of utility functions for cooling a data center, according to embodiments of the invention

FIG. 4A-C are a graphical representation of creating a utility model, according to one embodiment. Much like equation 1, FIG. 4A illustrates a utility function ($U_E(E)$) where utility decrease linearly as energy consumed increases to a maximum possible value ($E_0$). Unlike in equation 2, however, the temperature utility function ($U_T(T)$) in FIG. 4B shows temperature as a binary or step function. In other words, an administrator is perfectly content when the temperature at a certain location is below 80 degrees ($T_{IEK}$), but any temperature above 80 degrees is unacceptable. FIG. 4C is the combination of FIGS. 4A and 4B into a single utility function (U(E, T)). As expected, this combined utility function is completely governed by energy consumption until the temperature reaches 80 degrees. In this case, the maximum utility is achieved when as little energy as possible is consumed by the cooling mechanisms 155 so long as the temperature remains below 80 degrees.

Returning to FIG. 2, at step 215 the control parameters are correlated with the desired attributes. In general, a "control parameter" is any variable available to the integrated cooling system 130 that has an effect on a desired attribute. For the cooling mechanisms 155, the control parameters may include the fan of a CRAC 165 or the compressor of a rear-door heat exchanger 160. Alternatively, a control parameter may be a high-level instruction, such as a script, sent from the integrated cooling system 130 to the cooling mechanism 155.

With regards to the optimized layout component 170, a control parameter may be the optimal location of servers in the data center 100 to create cold or hot aisles, or alternative positions for perforated floor tiles. "Perforated floor tiles" increase air flow in cold aisles to help cool high density racks and hot spots. Further, a control parameter may include the addition of snorkels. "Snorkels" are Plexiglas casings that enclose at least a portion of a rack 198, usually the bottom. The snorkel focuses air from the bottom of the rack up to the servers that are above the top level of the snorkel.

The control parameters for the hardware tasking system 175 may be much more complex depending on the level of integration between the integrated cooling system 130 and the hardware systems 190. In general, the integrated cooling system 130 provides control parameters that instruct the workload scheduler 180 and workload migration component 185 to either postpone certain tasks or transfer tasks to a more efficiently cooled server 198. The workload scheduler 180 may set a threshold for the amount of time a task may run or disallow certain types of processes. For example, if any task that runs for more than two seconds is known to raise the temperature, the hardware workload monitor 120 informs the integrated cooling system 130 of any pending jobs that meet this criterion. The integrated cooling system 130 may then instruct the workload scheduler 180 to postpone these jobs. The delayed tasks may then be scheduled to run at a time when the hardware system 190 is historically known to be idle, or alternatively, the integrated cooling system 130 can continue to monitor the hardware system 190 and inform the workload scheduler 180 to run the tasks once the workload decreases.

The workload migration component 185 may transfer workload from air-cooled racks to the more efficient liquid-cooled racks. Because the integrated cooling system 130 has information of the layout of the data center 100 from the rack and server layout component 115, the system 130 has sufficient knowledge to correctly migrate workload. Alternatively, the workload migration component 185 may transfer work from a busier server 195 to an idle server 195 based on input from the hardware workload monitor 120.

In many cases, a more efficient solution may be achieved by a combination of the control parameters discussed above. This could be a combination of (1) different cooling parameters within a cooling system, such as decreasing the fan speed of a CRAC 165 but increasing the pump pressure of a rear-door heat exchanger 160, or (2) control parameters from the three different cooling systems. For example, one CRAC 165 might be turned completely off if snorkels were installed. Or a server 195 may be moved to a location closer to an A/C output plenum while simultaneously using the workload migration component 185 to assign additional jobs to the recently moved server 195.

At step 215, the cooling model component 135 uses these various types of control parameters to create models that represent the correlation between the parameters and the desired attributes. In one embodiment, the models are preloaded into the cooling model component 135. Regarding optimizing the layout of the data center 100, each control parameter (e.g., snorkel, perforated tile, or a location of a plenum) could already have a documented effect on temperature. For example, a snorkel enclosing half of a rack decreases the temperature of the servers in the bottom half of the rack by 40 percent and the servers at the top by 15 percent. Thus, the integrated cooling system can create a model for the snorkel's effect on temperature without experimentation. Models may also be obtained through basic physic models or from computational fluid dynamics. One of ordinary skill in the art will recognize that the present invention is not dependent on a particular model; thus, any model that has the characteristics described herein may be used.

In another embodiment, the model is created by experimentation on a particular data center. In such a case, the system conditions (e.g., power used by the hardware system 190 or temperature at a temperature sensor 105) may be held constant while the control parameters are swept to record the consequences on each desired attribute. An example of such an experiment is illustrated by FIG. 5A-5E.

Figure 5:
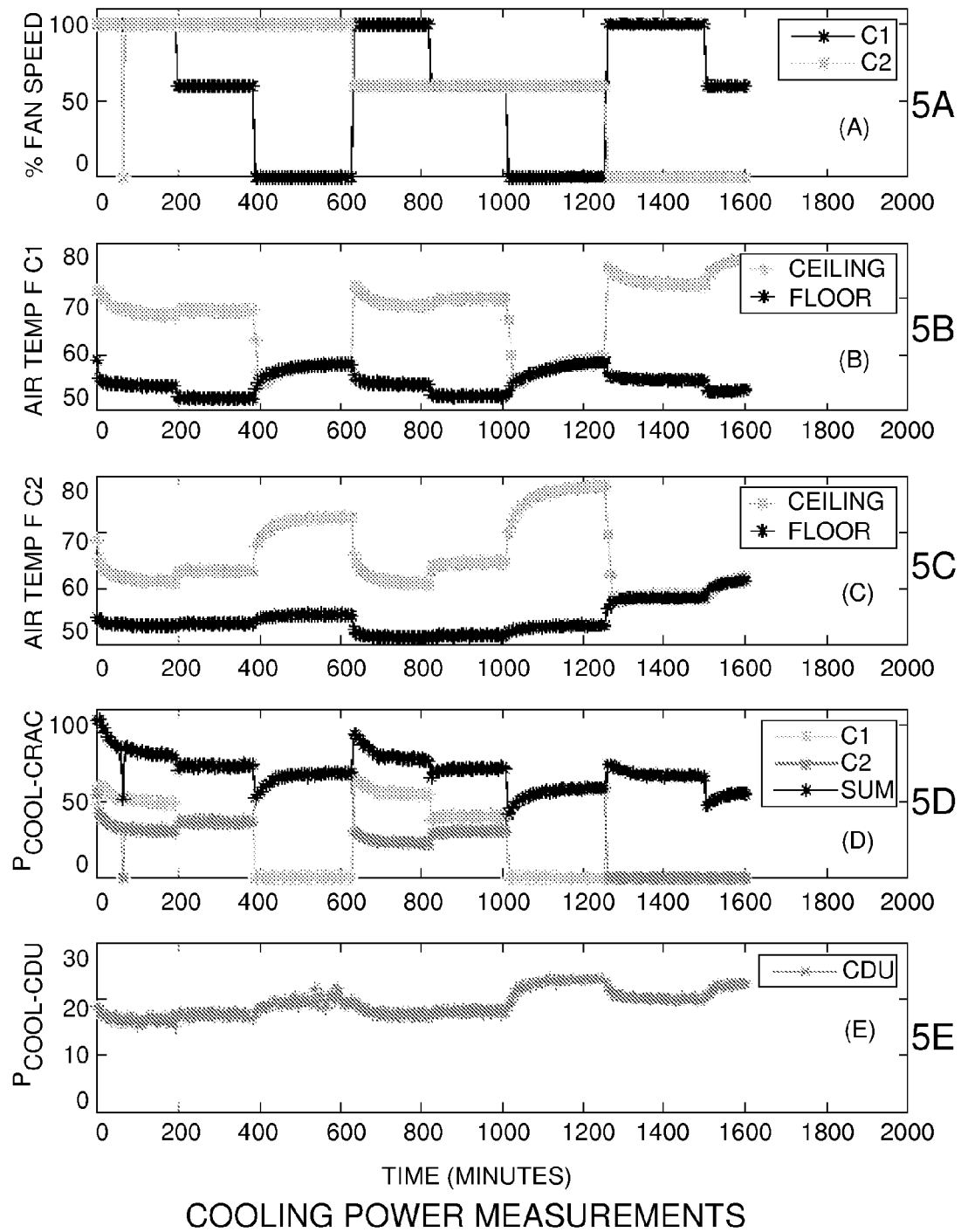
FIG. 5A-5E are graphical representations of experimental data used to create models for cooling a data center, according to embodiments of the invention

FIG. 5A-5E are a series of charts demonstrating the effect of two fan speeds (C1 and C2) on the temperature at the floor (FIG. 5B) and ceiling (FIG. 5C) of two CRAC units. In other embodiments, the measurements from pressure sensors, power meters, or some combination of sensors or meters may be used to create a model. During this experiment, the power consumed by the hardware system remained essentially constant. In FIG. 5A, the fan powers were swept through three values—100 percent, 60 percent, and 0 percent. All the possible combinations are shown except for when both fan powers were set to zero. The temperatures corresponding to each combination of fan power are recorded in FIGS. 5B and 5C. After running this experiment, the cooling model component 135 can create a model that correlates the fan speed, i.e., control parameter, to the temperature at the particular location, i.e., a desired attribute. A logical extension of this experiment is to change the power consumed by the hardware system 190 and sweep the fan powers again which provides the cooling model component 135 with yet another model. Note that these experimental models may all be done prior to full operation of the integrated cooling system 190. In other words, the experimental models could be obtained at one time during the start-up or configuration of a data center 100. Thus, whenever the system conditions change during normal operation (i.e., the power consumed by the hardware system increases and therefore emanates additional heat) the cooling model component 135 already contains the corresponding model.

At step 220, the cooling model component 135 sends the model that correlates each desired attribute to the control parameters to the utility component 215. In the basic example illustrated in FIG. 5D, the power consumed by the two fans is recorded. The total energy consumed by C1 and C2 is found by adding the power consumed by each fan and subtracting the energy consumed by the CDU (FIG. 5E). This sum may then be used to create an energy model based on the control parameters—i.e., the CRAC fan speeds.

$$E(\Theta_1, \Theta_2) = 6.32((\Theta_1)^{2.75} + (\Theta_2)^{2.75})). \qquad (4)$$

Equation 4 illustrates a simplified relationship between energy consumed ($E(\Theta_1, \Theta_2)$) and the fan speeds of C1 and C2–$\Theta_1$ and $\Theta_2$ respectively. With this model, the desired attribute (e.g., energy) is described in terms of only the control parameters, in this case, the fan speeds. The same can be done for temperature.

Referring back to the utility function of equation 3, this function is only described in terms of the desire attributes—i.e., energy and temperature. But the desired attributes are merely results. Conversely, the control parameters provide the integrated cooling system 130 with the means to actually achieve these results. Thus, the utility component 140 simply substitutes each model, which is in terms of the control parameters, into the utility function, which is in terms of the desired results. Equation 5 is an example of such a substitution.

$$U'(\Theta_1, \Theta_2) = U(E(\Theta_1, \Theta_2), T(\Theta_1, \Theta_2)) \qquad (5)$$

In Equation 5, $U'(\Theta_1, \Theta_2)$ is a utility function in the terms of only the control parameters $\Theta_1$ and $\Theta_2$. To achieve this, the previously developed model $E(\Theta_1, \Theta_2)$ found in equation 4 was substituted into the original utility function of equation 3. Though not shown, a model that relates temperature to the control parameters $\Theta_1$ and $\Theta_2$ is similarly substituted into equation 3. The utility component 140 now has a combined utility function that is in terms of only the control parameters. Optimizing this function gives the values for the control parameters that result in the desired attributes.

At step 225, the optimizer 145 uses the combined utility function $U'(\Theta_1, \Theta_2)$ to discover the values for the control parameters that yield the maximum utility. Accordingly, the optimizer 145 may use any sort of optimization technique to determine the best values for the control parameters from some set of available alternatives. One of ordinary skill in the art will recognize that the present invention is not dependent on a particular optimization technique and any technique that has the characteristics described herein may be used.

At step 230, the I/O component 150 of the integrated cooling system 130 transmits the optimized solution to the three different types of cooling systems: cooling mechanisms 155, optimized layout component 170 and hardware tasking system 175. Based on the desired attributes or user settings, the optimized solution from the optimizer 145 may use only one of the cooling systems or some combination thereof. Once the solution is implemented, the established control parameters continue to yield the desired attributes, such as maintaining a temperature range at a sensor by expending as little energy as possible.

However, FIG. 2 illustrates a static system that does not change if system conditions change. This implementation succeeds if the workload or the system conditions of a data center 100 remains unchanged. In some case, however, a dynamic integrated cooling system 130 is preferred.

Figure 3:
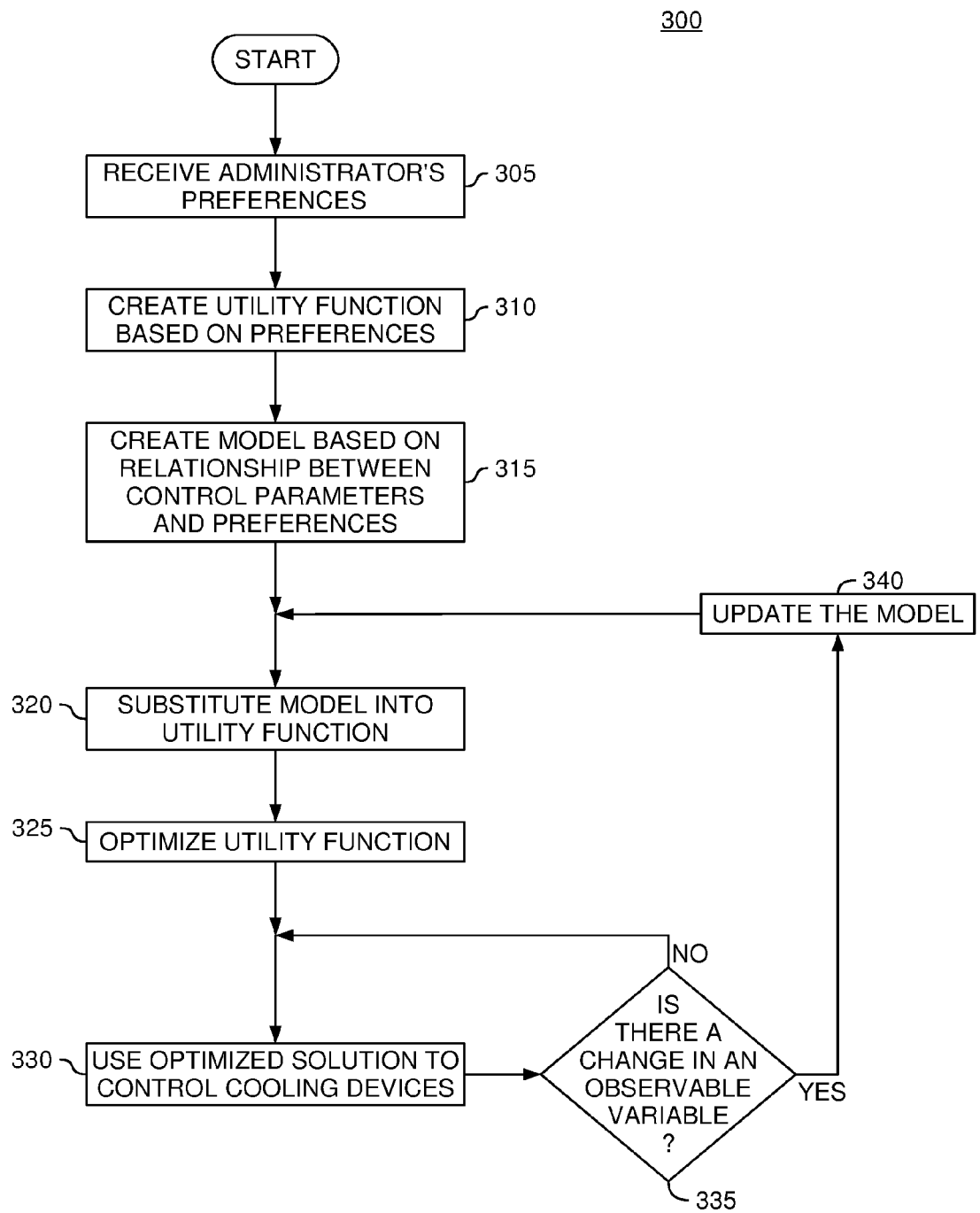
FIG. 3 is a flow diagram illustrating methods of cooling a data center, according to embodiments of the invention.

FIG. 3 illustrates a flowchart that demonstrates a dynamic integrated cooling system, according to one embodiment. FIG. 3 is essentially the same as FIG. 2 except for the adding steps of monitoring and updating the models—steps 335 and 340. After the optimized solution is transmitted to the various cooling systems at step 330, the integrated cooling system 130 continues to monitor observable variables of the data center 100. An "observable variable" is a general term used to describe any change in system conditions that affects a desired attribute. For example, an observable variable may include a change in temperature, workload of the hardware system 190, energy consumption due to poorly maintained cooling mechanisms 155, or the failure of a cooling mechanism 155 or server 195.

At step 335, the integrated cooling system 130 monitors the observable variables to determine if any change might affect a desired attribute. Advantageously, the integrated cooling system 130 monitors only the observable variables that affect the desired attributes established by the administrator. For example, if the administrator is concerned only about temperature and hardware failure, and the power meters 110 detect a rise in energy consumption, the integrated cooling system 130 may ignore the change since it does not affect a desired attribute.

In another embodiment, if a desired attribute is temperature and a sudden spike is recorded by a sensor 335, the integrated cooling system 130 then updates the model associated with the new temperature. As discussed previously, each model is based on certain system conditions or observable variables. Because the temperature at a sensor has changed, so does the model. At step 340, the cooling model component 135 then sends to the utility component 140 the model that relates the control parameters to the desired attributes given the new system conditions. In such a case, if the control parameters manage two CRAC units, the fan speeds may have to increase to dissipate the added heat.

Continuing the example above, a spike in temperature may not necessitate increasing the fan speed. Instead, the integrated cooling system 130 may use the hardware tasking system 175 and the workload scheduler 180 to postpone any jobs that have caused the temperature spike. Of course, this solution is dependent upon the appropriate model and the desired attributes originally set by the administrator.

In another example, a portion of the hardware system or a cooling mechanism 155 may fail. If it is the former, the integrated cooling system 130 may notice this change either by a decrease of temperature at a sensor 105 near the damaged hardware or an increase of temperature at sensors 105 near hardware systems 190 that are now shouldering this extra burden. In one embodiment, the integrated cooling system 130 may use the workload migration component 185 to move the extra workload to a server 195 that is cooled by a rear-door heat exchanger 160 (which is more efficient than a CRAC 165). If a cooling mechanism 155 failed instead of a server 195, the integrated cooling system 130 may notice this failure by the feedback loop shown in FIG. 1 that connects the cooling mechanism 155 to the I/O component 150, or by a rise in temperature near a rack 198 that is cooled by the particular cooling mechanism 155. In response, the integrated cooling system 130 may postpone the jobs running on that rack 198 using the workload scheduler 180 or use a model that excludes that cooling mechanism 155 as a control parameter. Presumably, the integrated cooling system 130 already created this model during a start-up or configuration phase anticipating that a cooling mechanism 155 may fail.

If the integrated cooling system 130 has not detected any change in an observable variable, the integrated cooling system 130 continues to transmit to the various cooling systems the same control parameters (step 330). The integrated cooling system 130 then loops back to step 335 to again verify that the system conditions remain unchanged.

Although not represented in the flowcharts of FIG. 2 or FIG. 3, the administrator may alter the desired attributes at anytime. Doing so generates both a new utility function and requires new models. Essentially, the integrated cooling system 130 repeats the steps of FIG. 2, but uses the changes to the desired attributes. As an example, the price of power may change thereby altering the cost utility function. Combining this new utility function with temperature results in a different combined utility function. When the appropriate models are substituted into this function at step 220, the optimizer 145 also produces a different solution for the control parameters than before. In another example, the administrator may discover that a particular hardware system 190 fails much more often at the current temperature than any other hardware component. Simply lowering the temperature is one solution but perhaps not the best when considering the cost of energy. Instead, the administrator can leave the desired temperature unchanged (since all the other hardware functions properly at that temperature) and use the cost of replacement for the failing hardware as another desired attribute. Thus, the integrated cooling system 130 finds the maximum utility between temperature, cost of energy and cost of replacement. Contrary to intuition, the optimal solution may be to keep the temperature constant and continue to replace the failing hardware components. The flexibility of utility functions provides the administrator with another tool to make the most economical decision possible.

The flowchart and block diagrams in the Figures illustrate the architecture, functionality and operation of possible implementations of systems, methods and computer program products according to various embodiments of the present invention. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method of controlling temperature in a computing environment, comprising:
   receiving a plurality of desired attributes for the computing environment, wherein a first desired attribute relates to a first system condition of the computing environment and a second desired attribute relates to a second system condition of the computing environment, wherein the first system condition is temperature;
   providing at least one control parameter in a computing environment, wherein the at least one control parameter affects at least the temperature and the second system condition of the computing environment;
   generating a cooling model representing the effect of the at least one control parameter on at least the first and second desired attributes;
   generating a first utility function for each desired attribute;
   creating a second utility function, wherein the second utility function is a combination of the first utility functions;
   generating a utility function for the computing environment based on the second utility function, the cooling model, and at least the first and second desired attributes; and
   setting a value of the at least one control parameter based on the utility function.

2. The method of claim 1, wherein the second system condition comprises at least one of: energy consumption, cost of energy consumption, cost of hardware replacement, environmental impact, system performance, and life expectancy of hardware.

3. The method of claim 1, wherein the cooling model represents the effect of a plurality of control parameters on at least the first and second desired attributes.

4. The method of claim 3, wherein the plurality of control parameters comprise of at least two of: a control setting of a fluid-cooling device, a layout of structures in the computing environment, snorkel, perforated floor tile, workload scheduler, and workload migration component.

5. A method of controlling at least one system condition in a computing environment, comprising:
   receiving a desired attribute for the computing environment, wherein the desired attribute specifies a desired value of the at least one system condition;
   providing a plurality of control parameters in a computing environment, wherein the control parameters affect the at least one system condition of the computing environment;
   generating a cooling model to relate the at least one system condition and the control parameters, wherein each control parameter manages a different type of cooling system, and wherein each type of cooling system uses a different cooling technique of affecting the at least one system condition of the computing environment;
   generating a first utility function for the desired attribute;
   generating a second utility function for the computing environment by substituting the cooling model into the first utility function;

determining a value for each of the control parameters based on the second utility function; and operating the cooling systems based on the values of the control parameters to achieve the desired attribute.

6. The method of claim 5, wherein different types of cooling systems comprises at least two of: air-cooling units, liquid-cooling units, a layout of a computer environment, and data center tasking software.

7. The method of claim 5, wherein a desired attribute of the computing environment comprises of at least one of: temperature, energy consumption, cost of energy consumption, cost of hardware replacement, environmental impact, system performance, and life expectancy of hardware.

* * * * *